(12) United States Patent
Yoshino et al.

(10) Patent No.: US 11,692,137 B2
(45) Date of Patent: Jul. 4, 2023

(54) INTERMEDIATE RAW MATERIAL, AND POLISHING COMPOSITION AND COMPOSITION FOR SURFACE TREATMENT USING THE SAME

(71) Applicant: FUJIMI INCORPORATED, Kiyosu (JP)

(72) Inventors: Tsutomu Yoshino, Kiyosu (JP); Ayano Yamazaki, Kiyosu (JP); Satoru Yarita, Kiyosu (JP); Shogo Onishi, Kiyosu (JP); Yasuto Ishida, Kiyosu (JP)

(73) Assignee: FUJIMI CORPORATION, Kiyosu (JP)

( * ) Notice: Subject to any disclaimer, the term of this patent is extended or adjusted under 35 U.S.C. 154(b) by 0 days.

(21) Appl. No.: 17/486,008

(22) Filed: Sep. 27, 2021

(65) Prior Publication Data
US 2022/0010207 A1    Jan. 13, 2022

Related U.S. Application Data

(62) Division of application No. 16/579,323, filed on Sep. 23, 2019, now abandoned.

(30) Foreign Application Priority Data

Sep. 25, 2018 (JP) ................. 2018-178741
Aug. 15, 2019 (JP) ................. 2019-149158

(51) Int. Cl.
| | | |
|---|---|---|
| *C09K 13/06* | (2006.01) | |
| *H01L 21/321* | (2006.01) | |
| *C09G 1/02* | (2006.01) | |
| *C09G 1/04* | (2006.01) | |
| *H01L 21/02* | (2006.01) | |
| *H01L 21/306* | (2006.01) | |
| *C09K 13/00* | (2006.01) | |
| *C09K 3/14* | (2006.01) | |
| *H01L 21/3105* | (2006.01) | |

(52) U.S. Cl.
CPC ............... *C09K 13/06* (2013.01); *C09G 1/02* (2013.01); *C09G 1/04* (2013.01); *C09K 3/1436* (2013.01); *C09K 13/00* (2013.01); *H01L 21/0206* (2013.01); *H01L 21/02057* (2013.01); *H01L 21/02065* (2013.01); *H01L 21/02068* (2013.01); *H01L 21/30604* (2013.01); *H01L 21/31053* (2013.01); *H01L 21/3212* (2013.01)

(58) Field of Classification Search
None
See application file for complete search history.

(56) References Cited

U.S. PATENT DOCUMENTS

| | | | |
|---|---|---|---|
| 10,703,936 B2 | 7/2020 | Yoshizaki et al. | |
| 2003/0115806 A1 | 6/2003 | Takami | |
| 2013/0174867 A1 | 7/2013 | Harada | |
| 2014/0242798 A1* | 8/2014 | Izawa | C09G 1/02 564/291 |
| 2019/0136161 A1 | 5/2019 | Kamimura et al. | |

FOREIGN PATENT DOCUMENTS

| | | |
|---|---|---|
| JP | 2003-142435 A | 5/2003 |
| JP | 2009-087523 A | 4/2009 |
| JP | 2012-074678 A | 4/2012 |
| TW | 201724236 A | 7/2017 |
| TW | 201809249 A | 3/2018 |
| WO | WO-2017/169808 A1 | 10/2017 |
| WO | WO-2018/013721 A1 | 1/2018 |

OTHER PUBLICATIONS

Final Office Action on U.S. Appl. No. 16/579,323 dated Oct. 1, 2021.
Akzoboble, Dada Sheet on Arquad T-50, version 7.0, dated Jan. 17, 2014 (Year: 2014).
Office Action issued in corresponding Taiwanese Patent Application No. 108132002, dated Oct. 17, 2022 (19 pages).
Office Action issued in corresponding Japanese Patent Application No. 2019-149158 dated Apr. 4, 2023 (6 pages).

* cited by examiner

*Primary Examiner* — Jiong-Ping Lu
(74) *Attorney, Agent, or Firm* — Foley & Lardner LLP

(57) ABSTRACT

An intermediate raw material according to the present invention includes a charge control agent having a critical packing parameter of 0.6 or more and a dispersing medium and a pH of the intermediate raw material is less than 7.

6 Claims, No Drawings

INTERMEDIATE RAW MATERIAL, AND POLISHING COMPOSITION AND COMPOSITION FOR SURFACE TREATMENT USING THE SAME

CROSS-REFERENCE TO RELATED APPLICATION

This application is a division of U.S. patent application Ser. No. 16/579,323, filed on Sep. 23, 2019, which is based upon and claims priority to Japanese Patent Application No. 2018-178741, filed on Sep. 25, 2018, and Japanese Patent Application No. 2019-149158, filed on Aug. 15, 2019. The entire contents of all of the above applications are incorporated herein in their entirety by reference.

BACKGROUND

1. Technical Field

The present invention relates to an intermediate raw material, and a polishing composition and a composition for surface treatment using the same. The present invention also relates to a method of producing a polishing composition and a composition for surface treatment, a surface treatment method and a polishing method, and a method of producing a semiconductor substrate.

2. Description of Related Arts

In recent years, a so-called chemical mechanical polishing (CMP) technique for physically polishing and flattening a semiconductor substrate in producing a device has been used in accordance with multilayer wiring on a surface of a semiconductor substrate. The CMP is a method for flattening a surface of a polishing object (object to be polished) such as a semiconductor substrate by using a polishing composition (slurry) containing abrasive grains such as of silica, alumina, or ceria, an anti-corrosion agent, a surfactant, or the like, and the polishing object (object to be polished) is, for example, silicon, polysilicon, silicon oxide, silicon nitride, a wiring or a plug formed of a metal, or the like.

In a general method of CMP, a polishing pad is attached on a circular polishing table (platen), a polishing pad surface is soaked with a polishing agent, a surface on which a wiring layer of a substrate is formed is pressed thereto, the polishing table is turned while a predetermined pressure (polishing pressure) is applied from a rear surface thereof, and the wiring layer is removed by mechanical friction between the polishing agent and the wiring layer. For example, JP-A-2003-142435 (corresponding to US 2003/0115806 A1) discloses a CMP technique for silicon oxide (TEOS film).

Further, in an object to be polished after a polishing step, a large amount of impurities (residues, foreign substances) remain. Examples of the impurities include organic substances such as abrasive grains derived from a polishing composition used in the CMP, a metal, an anti-corrosive, and a surfactant, silicon-containing materials which are the object to be polished, silicon-containing materials or metal produced by polishing metal wires, plugs, or the like, and further, organic substances such as pad waste produced from various pads or the like, and the like. Contamination of the surface of the object to be polished after polishing may be defects of the product using the object to be polished after polishing, and may result in performance degradation and reliability decrease. For example, when a surface of a semiconductor substrate is contaminated by the impurities, electrical properties of the semiconductor are likely to be adversely affected and reliability of the device is likely to be reduced. Therefore, it is desirable to introduce a surface treatment step such as a cleaning step after the polishing step to remove the impurities from the surface of the object to be polished after polishing.

As a composition for surface treatment used for such a surface treatment step, for example, JP-A-2012-74678 (corresponding to the specification of US 2013/0174867 A1) discloses a cleaning liquid for semiconductor device substrates, comprising a polycarboxylic acid or a hydroxycarboxylic acid, a sulfonic acid type anionic surfactant, a carboxylic acid type anionic surfactant, and water.

SUMMARY

However, according to the investigation of the present inventors, it has been found that when the polishing composition disclosed in JP-A-2003-142435 (corresponding to US 2003/0115806 A1) is applied to polishing of an object to be polished containing silicon nitride, silicon oxide, or polysilicon, a polishing speed is insufficient. Further, it has been found that the cleaning liquid disclosed in JP-A-2012-74678 (corresponding to the specification of US 2013/0174867 A1) has a problem in that when the cleaning liquid is applied to cleaning of an object to be polished containing silicon nitride, silicon oxide, or polysilicon after polishing, residues cannot be sufficiently removed.

As a result of the investigation of the present inventors on the cause of the problems, it has been found that a zeta potential of an object to be polished or an object to be polished after polishing cannot be sufficiently adjusted.

Therefore, an object of the present invention is to provide a means capable of arbitrarily adjusting a zeta potential of an object to be polished or an object to be polished after polishing.

The present inventors have conducted intensive studies in order to solve the above problems. As a result, it has been found that the above problem can be solved by an intermediate raw material including a charge control agent having a critical packing parameter of 0.6 or more and a dispersing medium and whose pH is less than 7.

DETAILED DESCRIPTION

Hereinafter, one or more embodiments of the present invention will be described. However, the scope of the invention is not limited to the disclosed embodiments. Further, unless otherwise stated, operation and measurement of physical properties and the like are performed under the conditions of room temperature (in the range of 20° C. or more and 25° C. or less)/a relative humidity of 40% RH or more and 50% RH or less.

Further, "(meth)acrylate" is a generic term for acrylate and methacrylate. Likewise, a compound containing (meth) such as (meth)acrylic acid and the like are also a generic term for a compound having "meth" or a compound which does not have "meth" in the term.

The intermediate raw material according to an embodiment of the present invention includes a charge control agent having a critical packing parameter of 0.6 or more and a dispersing medium, and has pH of less than 7. According to the intermediate raw material, a zeta potential of an object to be polished or an object to be polished after polishing can be arbitrarily adjusted.

The critical packing parameter (CPP) is a general parameter for explaining the relationship between a molecular structure and an association structure. A charge control agent having the critical packing parameter of 0.6 or more is considered to form a coating having a regular lamellar structure (bilayer membrane) on an object to be polished (or an object to be polished after polishing). A zeta potential of a surface of an object to be polished (or an object to be polished after polishing) having the coating formed thereon can be arbitrarily adjusted, and a difference in zeta potential from the abrasive grains used in CMP can be easily controlled. Thus, attraction and repulsion between the surface of the object to be polished and the abrasive grains can be easily controlled. When a polishing composition obtained from an intermediate raw material including a charge control agent having a critical packing parameter of 0.6 or more and a dispersing medium is used, an effect of obtaining a desired polishing speed can be exhibited.

Further, it is considered that the charge control agent having a critical packing parameter of 0.6 or more penetrates an area between a surface of an object to be polished after polishing and residues floating from the surface of the object to be polished after polishing in a surface treatment step, and forms a coating having a regular lamella structure (bilayer membrane). Therefore, a zeta potential of a surface of an object to be polished after polishing can be arbitrarily adjusted, and repulsive force between the residues and the surface of the object to be polished after polishing can be easily produced. Further, reattachment of the residues to the surface of the object to be polished after polishing can be prevented by forming the coating. By this action, the number of residues on a surface of an object to be polished after a surface treatment step can be reduced, and when a composition for surface treatment obtained from the intermediate raw material including the charge control agent having a critical packing parameter of 0.6 or more and the dispersing medium is used, an effect of reducing the number of residues on a surface of an object to be polished after polishing can be obtained.

The mechanism is based on presumption and the correctness thereof does not affect the technical scope of the present invention.

[Object to be Polished and Object to be Polished after Polishing]

It is preferred that the polishing composition obtained from the intermediate raw material of the present invention be used for polishing an object to be polished containing at least one selected from the group consisting of silicon nitride, silicon oxide, and polysilicon. Examples of the object to be polished containing silicon oxide include TEOS type silicon oxide surface produced by using tetraethyl orthosilicate as a precursor (hereinafter, also simply referred to as "TEOS"), an HDP (High Density Plasma) film, a USG (Undoped Silicate Glass) film, a PSG (Phosphorus Silicate Glass) film, a BPSG (Boron-Phospho Silicate Glass) film, a RTO (Rapid Thermal Oxidation) film, and the like.

It is preferred that the composition for surface treatment obtained from the intermediate raw material of the present invention be used for treating a surface of an object to be polished after polishing containing at least one selected from the group consisting of silicon nitride, silicon oxide, and polysilicon. In the present description, the object to be polished after polishing means an object to be polished which has been polished in the polishing step. The polishing step is not particularly limited, but is preferably a CMP step. Since the examples of the object to be polished after polishing containing silicon oxide are as described above, description thereof will be omitted herein.

The object to be polished after polishing is preferably a polishing-completed semiconductor substrate (a semiconductor substrate which has been completed polishing, and more preferably a semiconductor substrate after CMP (a semiconductor substrate which has been subjected to CMP). The reason therefor is that since in particular, organic residues can cause a failure of a semiconductor device, when the object to be polished after polishing is a semiconductor substrate after polishing, a step of removing the organic residues as much as possible is required as a cleaning step of the semiconductor substrate.

The object to be polished (or the object to be polished after polishing) containing silicon nitride, silicon oxide, or polysilicon is not particularly limited, but examples thereof include an object to be polished (or an object to be polished after polishing) composed of each of silicon nitride, silicon oxide, and polysilicon alone, an object to be polished (or an object to be polished after polishing), on a surface of which, in addition to silicon nitride, silicon oxide, and polysilicon, other materials are exposed, and the like. Here, examples of the former include a silicon nitride substrate, a silicon oxide substrate, a polysilicon substrate which are a semiconductor substrate, and the like. Further, for the latter, the materials other than silicon nitride, silicon oxide, or polysilicon are not particularly limited, but examples thereof include metals such as tungsten, copper, aluminum, hafnium, cobalt, nickel, titanium, and alloys thereof; silicon-containing materials, such as silicon carbonitride (SiCN), BD (black diamond: SiOCH), FSG (fluorosilicate glass), HSQ (hydrogen silsesquioxane), CYCLOTENE, SiLK, MSQ (methyl silsesquioxane), amorphous silicon, single crystal silicon, n-type doped single crystal silicon, p-type doped single crystal silicon, and an Si-based alloy such as SiGe; and the like.

<Intermediate Raw Material>

The intermediate raw material according to an embodiment of the present invention contains a charge control agent having a critical packing parameter of 0.6 or more, and a dispersing medium. The intermediate raw material can be a raw material of a composition for surface treatment and a polishing composition according to an embodiment of the present invention.

[Charge Control Agent Having a Critical Packing Parameter of 0.6 or More]

The intermediate raw material according to an embodiment of the present invention essentially contains a charge control agent having a critical packing parameter of 0.6 or more (hereinafter, also simply referred to as "charge control agent"). The charge control agent is, as described above, considered to form a coating having a regular lamellar structure (bilayer membrane) on a surface of an object to be polished (or an object to be polished after polishing). By such action, a zeta potential of the object to be polished (or the object to be polished after polishing) can be arbitrarily adjusted, and the composition for surface treatment and polishing composition according to an embodiment of the present invention which contain the intermediate raw material have improved their performance.

When a compound having a critical packing parameter less than 0.6 is used, it is difficult to form a coating having a regular lamellar structure (bilayer membrane), or even in the case that a film is formed, the film becomes a monolayer membrane, and thus, the effect of the present invention cannot be obtained.

Here, the critical packing parameter is a parameter modeled using a molecular modeling module called Discover (registered trademark) in Materials Studio (Materials Studio v4.3.0.0. Copyright 2008, Accelrys Software Inc.), in order to determine a shape of one compound (especially surfactant). Compounds (especially surfactant) are modeled by defining atoms and assuming a harmonic potential of bond using a pcff force field. This force field was developed based on CFF91. Further details on this type of modeling can be found in the study by Allen and Tildesley (1 M. P. Allen; D. J. Tildesley, Computer Simulation of Liquids, Oxford University Press (1987)).

In the present invention, the critical packing parameter is calculated based on the above definition.

When two or more charge control agents are used, the critical packing parameter is used as an average value. The average value can be calculated according to a mole fraction of the two or more charge control agents used. For example, when two kinds of component A and component B are used, the average critical packing parameter is calculated by the following equation:

Average critical packing parameter=Critical packing parameter of $A$×Mole fraction of $A$+Critical packing parameter of $B$×Mole fraction of $B$ The charge control agent according to the present invention is not particularly limited as long as the critical packing parameter is 0.6 or more, and can be suitably used. Examples of the charge control agent having a critical packing parameter of 0.6 or more include carboxylic acid, organic sulfonic acid, organic sulfuric acid, organic phosphoric acid, organic phosphoric acid, and salts thereof, and anionic surfactants, and the like which critical packing parameter falls in the above range of.

Specific examples of the charge control agent having a critical packing parameter of 0.6 or more include dilauryl hydrogen phosphite, triphenyl phosphite, trioleyl phosphite, diphenyl mono (2-ethylhexyl) phosphite, tetraphenyl tetra (tridecyl) pentaerythritol tetraphosphite, tetra (C12-C15 alkyl) 4,4'-isopropylidenediphenyl phosphite, 2-ethylhexyl acid phosphate, polyoxyethylene (n=3) styrenated phenyl ether ammonium sulfate, polyoxyethylene (n=5) styrenated phenyl ether ammonium sulfate, polyoxyethylene (n=7) styrenated ammonium phenyl ether sulfate, polyoxyethylene (n=12) styrenated phenyl ether ammonium sulfate, polyoxyethylene (n=1-8) aryl phenyl ether sulfate ester amine salt, aromatic polyoxyethylene (n=1-5) sulfate ester, tristyryl phenyl ether polyoxyethylene (n=1-8) sulfuric acid ester, polyoxyethylene (n=1-8) aryl phenyl ether phosphate ester amine salt, aromatic polyoxyethylene (n=1-5) phosphate ester, polyoxyethylene (n=1-8) triaryl phenyl ether phosphate ester, polyoxyethylene (n=1-8) triaryl alkyl phenyl ether phosphate ester, polyoxyethylene (n=1-8) aryl phenyl ether carboxylic acid amine salt, aromatic polyoxyethylene (n=1-5) carboxylic acid, tristyryl phenyl ether polyoxyethylene (n=1-8) carboxylic acid, and the like. The "n" represents the number of ethylene oxide units present in one molecule.

It is preferred that the charge control agent has at least one of a substituted or unsubstituted linear or branched alkyl group having 8 to 20 carbon atoms and a substituted or unsubstituted aryl group having 6 to 20 carbon atoms, as a hydrophobic group, from a viewpoint of easily forming a coating having a regular lamellar structure (bilayer membrane) and further improving the effect of the present invention. Among them, the charge control agent contains preferably a substituted or unsubstituted aryl group having 6 to 20 carbon atoms, and still more preferably two or more substituted or unsubstituted aryl groups having 6 to 20 carbon atoms. It is considered that this is because the coating having a regular lamellar structure (bilayer membrane) is more easily formed by having an aryl group having a bulky structure. Further, from a viewpoint that a coating having a regular lamellar structure (bilayer membrane) is easily formed and the effect of the present invention is more easily improved, it is preferred that the charge control agent has at least one selected from the group consisting of a sulfuric acid group, a sulfonic acid group, a phosphoric acid group, a phosphate ester group, and a phosphite ester group, as a hydrophilic group.

From a viewpoint that a coating having a regular lamellar structure (bilayer membrane) is easily formed and the effect of the present invention is more easily improved, the charge control agent having a critical packing parameter of 0.7 or more is preferred, and the charge control agent having a critical packing parameter of 0.9 or more is more preferred. From the same point of view, the charge control agent having a critical packing parameter of 1.5 or less is preferred, and the charge control agent having a critical packing parameter of 1.2 or less is more preferred.

The charge control agent can be used alone or in combination of two or more.

The lower limit of a content (concentration) of the charge control agent in the intermediate raw material according to an embodiment of the present invention is not particularly limited, but is preferably 0.01% by mass or more, more preferably 0.05% by mass or more, and still more preferably 0.1% by mass or more, based on a total mass of the intermediate raw material. Further, the upper limit of a content (concentration) of the charge control agent in the intermediate raw material according to an embodiment of the present invention is not particularly limited, but is preferably 20% by mass or less, more preferably 10% by mass or less, and still more preferably 5% by mass or less, based on a total mass of the intermediate raw material. Within the range, the effect of lowering a zeta potential of an object to be polished (or an object to be polished after polishing) can be further improved.

[Dispersing Medium]

The intermediate raw material according to an embodiment of the present invention includes a dispersing medium (solvent). The dispersing medium serves to disperse or dissolve each component.

The dispersing medium can be used alone or in combination of two or more.

The dispersing medium is not particularly limited, but preferably includes water. A content of water in the dispersing medium is not particularly limited, but is preferably 50% by mass or more, and more preferably 90% by mass or more, based on a total mass of the dispersing medium, and still more preferably, the dispersing medium consists only of water. It is preferred that water contain impurities as little as possible, from a viewpoint of preventing contamination of an object to be cleaned and inhibition of the action of other components. For example, water having a total content of transition metal ions of 100 ppb or less is preferred. Here, the purity of water can be increased for example, by operations such as removal of impurity ions using an ion exchange resin, removal of foreign matter by a filter, and distillation. Specifically, as water, for example, deionized water (ion exchange water), pure water, ultrapure water, distilled water, and the like are preferably used.

Further, the dispersing medium may be an organic solvent or a mixed solvent of water and an organic solvent, as long as the dispersing medium can improve dispersibility or solubility of each component. The organic solvent is not particularly limited, and known organic solvents can be used. When a mixed solvent of water and an organic solvent is used, acetone, acetonitrile, ethanol, methanol, isopropanol, glycerin, ethylene glycol, propylene glycol, or the like which is an organic solvent miscible with water, is preferably used. When an organic solvent is used, each component may be added to a mixed solvent obtained by mixing water and an organic solvent and dispersed or dissolved therein, or each component may be dispersed or dissolved using the organic solvent which is not mixed with water and then mixed with water. The organic solvent can be used alone or in combination of two or more.

When the intermediate raw material according to an embodiment of the present invention having such a configuration is used, a zeta potential of an object to be polished or an object to be polished after polishing can be sufficiently lowered. As an example, when an object to be polished or an object to be polished after polishing contains TEOS or SiN, a zeta potential can be −10 mV or less, more preferably −15 mV or less, and still more preferably −20 mV or less. The zeta potential of the object to be polished or the object to be polished after polishing in contact with the intermediate raw material or the polishing composition or composition for surface treatment including the intermediate raw material can be measured by the method described in the Examples.

<Composition for Surface Treatment>

The intermediate raw material according to an embodiment of the present invention can be used for a composition for surface treatment which is used for treating a surface of an object to be polished after polishing. That is, another embodiment of the present invention relates to a composition for surface treatment used for treating a surface of an object to be polished after polishing, which includes the intermediate raw material of the present invention, which has pH of less than 7. In other words, the embodiment relates to a composition for surface treatment used for treating a surface of an object to be polished after polishing, which includes the charge control agent having a critical packing parameter of 0.6 or more and the dispersing medium (preferably water), which has pH of less than 7. Such a composition for surface treatment according to the present invention can sufficiently reduce residues on a surface of an object to be polished after polishing.

The residues on the surface of the object to be polished after polishing may include organic residues, particle residues, other residues, and the like. The organic residues represent a component composed of organic compounds such as an organic low molecular compound or polymer compound or salts thereof or the like, among residues attached to a surface of an object to be polished after polishing (object to be subjected to surface treatment). The particle residues represent a component derived from a granular inorganic substance such as abrasive grains (for example, abrasive grains containing ceria) included in the polishing composition. The other residues include residues composed of components other than the organic residues and the particle residues, a mixture of the organic residues and particle residues, and the like.

The composition for surface treatment according to an embodiment of the present invention may include another component(s) except for the charge control agent and the dispersing medium, within the range that the effect of lowering a zeta potential of a surface of an object to be polished after polishing and the effect as the composition for surface treatment are not inhibited. An example of the another components includes an ionic dispersant. Hereinafter, an ionic dispersant will be described.

[Ionic Dispersant]

It is preferred that the composition for surface treatment according to an embodiment of the present invention further include an ionic dispersant. The ionic dispersant contributes to removal of foreign matter due to the composition for surface treatment. Therefore, the composition for surface treatment including the ionic dispersant can sufficiently remove residues (impurities containing organic residues and the like) on a surface of an object to be polished after polishing, in the surface treatment (cleaning or the like) of the object to be polished after polishing.

Examples of the ionic dispersant include polymer compounds having a sulfonic acid (salt) group; polymer compounds having a phosphoric acid (salt) group; polymer compounds having a phosphoric acid (salt) group; polymer compounds having a carboxylic acid (salt) group; water-soluble polymers containing a nitrogen atom such as polyvinyl pyrrolidone (PVP), polyvinyl imidazole (PVI), polyvinyl carbazole, polyvinyl caprolactam, polyvinyl piperidine, and polyacryloyl morpholine (PACMO); polyvinyl alcohol (PVA); hydroxyethyl cellulose (HEC); and the like.

Among them, a polymer compound having a sulfonic acid (salt) group is preferred. Hereinafter, the polymer compound having a sulfonic acid (salt) group will be described.

<Polymer Compound Having a Sulfonic Acid (Salt) Group>

In the composition for surface treatment according to an embodiment of the present invention, it is preferred that the ionic dispersant be a polymer compound having a sulfonic acid (salt) group. The polymer compound having a sulfonic acid (salt) group (herein, also simply referred to as "a sulfonic acid group-containing polymer") further contributes to the removal of foreign matter by the composition for surface treatment. Therefore, the composition for surface treatment including the sulfonic acid group-containing polymer has an effect of more easily removing a foreign matter (impurities containing organic residues and the like) remaining on a surface of a polishing-completed object to be polished, in the surface treatment (cleaning or the like) of the polishing-completed object to be polished.

The sulfonic acid group-containing polymer can form micelles by affinity between a portion other than the sulfonic acid (salt) group (that is, a polymer chain portion of the sulfonic acid group-containing polymer) and the foreign matter (especially a hydrophobic component). Therefore, by dissolving or dispersing the micelles in the composition for surface treatment, the foreign matter which is a hydrophobic component is considered to be also effectively removed.

Further, when the surface of the object to be polished after polishing is cationic under acidic conditions, the sulfonic acid group is anionized to facilitate adsorption to the surface of the polishing-completed object to be polished. As a result, it is considered that the surface of the object to be polished after polishing is in the state of being covered with the sulfonic acid group-containing polymer. On the other hand, since the sulfonic acid group of the sulfonic acid group-containing polymer is easily adsorbed to the remaining foreign matter (especially those being easily cationized), the surface of the foreign matter is anionized. Therefore, the foreign matter of which the surface becomes anionic and the anionized sulfonic acid group of the sulfonic acid group-containing polymer adsorbed on the surface of the polishing-completed object to be polished electrostatically repel each other. Further, when the foreign matter is anionic, the foreign matter itself electrostatically repels anionized sulfonic acid group present on the polishing-completed object to be polished. Therefore, it is considered that the foreign matter can be more effectively removed by utilizing such electrostatic repulsion.

Furthermore, when the polishing-completed object to be polished is difficult to be charged, it is presumed that the foreign matter is removed by a mechanism different from the above. First, it is considered that foreign matter (especially hydrophobic components) is in the state of being easily attached to a hydrophobic polishing-completed object to be polished by hydrophobic interaction. Here, the polymer chain portion (hydrophobic structural site) of the sulfonic acid group-containing polymer is directed to the surface side of the polishing-completed object to be polished due to the hydrophobicity, while the anionized sulfonic acid group or the like which is a hydrophilic structural site is directed to the opposite side to the surface side of the polishing-completed object to be polished. Thus, it is presumed that the surface of the polishing-completed object to be polished is in the state of being covered with the anionized sulfonic acid group and becomes hydrophilic. As a result, it is considered that hydrophobic interaction hardly occurs between the foreign matter (especially hydrophobic components) and the polishing-completed object to be polished and the adhesion of the foreign matter is further suppressed.

The mechanism is based on presumption and the correctness thereof does not affect the technical scope of the present invention.

In the present description, the "sulfonic acid (salt) group" represents a sulfonic acid group ($-SO_3H$) or a group of a salt thereof ($-SO_3M^2$; wherein $M^2$ is an organic or inorganic cation).

The sulfonic acid group-containing polymer is not particularly limited as long as it has a plurality of sulfonic acid (salt) groups, and known compounds can be used. Examples of the sulfonic acid group-containing polymer include a polymer compound obtained by sulfonizing a polymer compound as a base, a polymer compound obtained by (co) polymerizing a monomer having a sulfonic acid (salt) group, and the like.

More specifically, sulfonic acid (salt) group-containing polyvinyl alcohol (sulfonic acid-modified polyvinyl alcohol), sulfonic acid (salt) group-containing polystyrene such as polystyrene sulfonic acid and sodium polystyrene sulfonate, sulfonic acid (salt) group-containing polyvinyl acetate (sulfonic acid-modified polyvinyl acetate), sulfonic acid (salt) group-containing polyester, a copolymer of (meth)acryloyl group-containing monomer and sulfonic acid (salt) group-containing monomer such as a copolymer of (meth)acrylic acid and sulfonic acid (salt) group-containing monomer, and the like may be included. The sulfonic acid group-containing polymer can be used alone or in combination of two or more. At least a portion of the sulfonic acid group of these polymers may be in the form of a salt. Examples of the salt include alkali metal salts such as a sodium salt and a potassium salt, salts of Group 2 element such as a calcium salt and a magnesium salt, an amine salt, an ammonium salt, and the like.

Further, when the sulfonic acid group-containing polymer is sulfonic acid group-containing polyvinyl alcohol, a saponification degree thereof is preferably 80% or more, and more preferably 85% or more (upper limit of 100%), from a viewpoint of solubility.

In the present invention, it is preferred that a weight average molecular weight of the sulfonic acid group-containing polymer be 1,000 or more. When the weight average molecular weight is 1,000 or more, the effect of removing foreign matter can be further enhanced. The reason therefor is presumed to be that coatability in covering the polishing-completed object to be polished or foreign matter is improved, and the action of removing foreign matter from the surface of the object to be cleaned or the action of inhibiting reattachment of the organic residues on the surface of the polishing-completed object to be polished is further improved. From the same point of view, the weight average molecular weight is more preferably 2,000 or more, and still more preferably 8,000 or more.

Further, it is preferred that the weight average molecular weight of the sulfonic acid group-containing polymer be 100,000 or less. When the weight average molecular weight is 100,000 or less, the effect of removing foreign matter can be further enhanced. The reason therefor is presumed to be that the removability of the sulfonic acid group-containing polymer after a cleaning step is improved. From the same point of view, the weight average molecular weight is more preferably 50,000 or less, and still more preferably 40,000 or less.

The weight average molecular weight can be measured by gel permeation chromatography (GPC), and specifically, can be measured by the method described in the Examples.

As the sulfonic acid group-containing polymer, a synthetic product may be used or a commercially available product may be used.

It is preferred that a content (concentration) of the sulfonic acid group-containing polymer be 0.01% by mass or more, based on a total mass of the composition for surface treatment. When the content of the sulfonic acid group-containing polymer is 0.01% by mass or more, the effect of removing foreign matter can be more improved. The reason therefor is presumed to be that the sulfonic acid group-containing polymer is covered in a larger area when covering the polishing-completed object to be polished or the foreign matter. Thus, since it becomes easy especially for the foreign matter to form micelles, the effect of removing the foreign matter by dissolution/dispersion of the micelles can be improved. Further, it is presumed that it is because increase in the number of sulfonic acid (salt) groups can express the electrostatic adsorption or repulsion effect more strongly. From the same point of view, the content (concentration) of the sulfonic acid group-containing polymer is more preferably 0.03% by mass or more, and still more preferably 0.05% by mass or more, based on the total mass of the composition for surface treatment. Further, it is preferred that the content (concentration) of the sulfonic acid group-containing polymer be 5% by mass or less, based on the total mass of the composition for surface treatment. When the content (concentration) of the sulfonic acid group-containing polymer is 5% by mass or less, the effect of removing foreign matter can be further enhanced. The reason therefor is presumed to be that the removability of the sulfonic acid group-containing polymer itself after a cleaning step can be improved. From the same point of view, the content of the sulfonic acid group-containing polymer is more preferably 3% by mass or less, still more preferably 2% by mass or less, and particularly preferably 1% by mass or less, based on the total mass of the composition for surface treatment.

According to an embodiment of the present invention, it is preferred that a content of the sulfonic acid group-containing polymer in the ionic dispersant be more than 80% by mass (an upper limit of 100% by mass), based on a total mass of the ionic dispersant. When the content of the sulfonic acid group-containing polymer is more than 80% by mass, based on the total mass of the ionic dispersant included in the composition for surface treatment, the effect of removing foreign matter can be further improved. The reason therefor is that an amount of the ionic dispersant other than the sulfonic acid group-containing polymer which can cause foreign matter after a cleaning step be reduced. Further, it is presumed that when the sulfonic acid group-containing polymer covers the polishing-completed object to be polished and the foreign matter, inhibition of covering with an ionic dispersant other than the sulfonic acid group-containing polymer can be suppressed. From the same point of view, the content of the sulfonic acid group-containing polymer is more than preferably 95% by mass, based on the total mass of the ionic dispersant included in the composition for surface treatment. In such a case, the effect of removing foreign matter can be significantly improved.

Furthermore, the content of the sulfonic acid group-containing polymer is particularly preferably 100% by mass, based on the total mass of the ionic dispersant included in the composition for surface treatment. That is, the ionic dispersant included in the composition for surface treatment is particularly preferably only the sulfonic acid group-containing polymer.

In the present description, the "polymer compound" refers to a compound having a weight average molecular weight of 1,000 or more.

In the present invention, as the ionic dispersant, a copolymer containing a constituent unit derived from a monomer having a sulfonic acid group and a constituent unit derived from a monomer having a carboxylic acid group (hereinafter, also simply referred to as a "sulfonic acid/carboxylic acid copolymer") can be used.

Examples of the monomer having a sulfonic acid group include a polyalkylene glycol-based monomer (A) described in paragraphs [0019] to [0036] of JP-A-2015-168770, a sulfonic acid group-containing monomer (C) described in paragraphs [0041] to [0054] of the same Japanese publication, and the like, the contents of which are incorporated herein in their entirety.

Examples of the monomer having a carboxylic acid group include acrylic acid, methacrylic acid, crotonic acid, α-hydroxyacrylic acid, α-hydroxymethylacrylic acid, and salts thereof such as metal salts, ammonium salt, and organic amine salts.

A preferred range of the weight average molecular weight of the sulfonic acid/carboxylic acid copolymer is the same as the preferred range of the sulfonic acid group-containing polymer as described above. The weight average molecular weight can be measured by gel permeation chromatography (GPC), and specifically, can be measured by the method described in the Examples.

Further, a mole ratio between the constituent unit derived from the monomer having a sulfonic acid group and the constituent unit derived from the monomer having a carboxylic acid group in the sulfonic acid/carboxylic acid copolymer is the constituent unit derived from the monomer having a sulfonic acid group: the constituent derived from the monomer having a carboxylic acid group of preferably 10:90 to 90:10, more preferably 30:70 to 90:10, and still more preferably 50:50 to 90:10.

The lower limit of a content (concentration) of the charge control agent in the composition for surface treatment according to an embodiment of the present invention is not particularly limited, but is preferably 0.005% by mass or more, more preferably 0.01% by mass or more, and still more preferably 0.1% by mass or more, based on a total mass of the composition for surface treatment. Further, the upper limit of the content (concentration) of the charge control agent in the composition for surface treatment according to an embodiment of the present invention is not particularly limited, but is preferably 10% by mass or less, more preferably 5% by mass or less, and still more preferably 3% by mass or less, based on the total mass of the composition for surface treatment. Within the range, residues of a surface of an object to be polished after polishing can be further reduced.

[Residue Reduction Effect]

After an object to be polished after polishing is treated using the composition for surface treatment according to an embodiment of the present invention, it is preferred that the number of residues on the surface of the object to be polished after polishing be as small as possible. Specifically, the number of the residues on the surface after treatment is preferably 300 or less, more preferably 250 or less, still more preferably 200 or less, and particularly preferably 150 or less (a lower limit of 0). As the number of residues, a value measured by the method described in the Examples, after treatment by the method described in the Examples, is adopted.

<Polishing Composition>

The intermediate raw material according to an embodiment of the present invention is used with abrasive grains to become a polishing composition used for polishing an object to be polished. That is, another embodiment of the present invention relates to a polishing composition used for polishing the object to be polished, which includes the intermediate raw material of the present invention and abrasive grains, and has pH of less than 7. In other words, the embodiment is a polishing composition used for polishing the object to be polished, which includes a charge control agent having a critical packing parameter of 0.6 or more, a dispersing medium, and abrasive grains, and has pH of less than 7. Such a polishing composition according to the present invention can polish an object to be polished at a desired polishing speed. Hereinafter, abrasive grains will be described.

[Abrasive Grains]

The abrasive grains included in the polishing composition according to an embodiment of the present invention serves to mechanically polish an object to be polished and to improve a polishing speed.

The abrasive grains may be any one of inorganic particles, organic particles, and organic inorganic composite particles. Examples of the inorganic particles include particles composed of metal oxides such as silica, alumina, ceria, and titania, silicon nitride particles, silicon carbide particles, and boron nitride particles. Specific examples of the organic particles include polymethyl methacrylate (PMMA) particles. Among them, from the viewpoint of easy availability and cost, it is preferred to contain silica, it is more preferred to contain fumed silica or colloidal silica, and it is still more preferred to contain colloidal silica.

Further, abrasive grains may be surface-modified. As the surface-modified abrasive grains, silica having an organic acid immobilized on the surface thereof (organic acid-modified silica) is preferred, fumed silica or colloidal silica having an organic acid immobilized on the surface thereof is more preferred, and colloidal silica having an organic acid immobilized on the surface thereof is still more preferred. The organic acid is not particularly limited, but examples thereof include sulfonic acid, carboxylic acid, phosphoric acid, and the like. Among them, sulfonic acid or carboxylic acid is preferred, and sulfonic acid is more preferred. A method of introducing the organic acid to the surface of abrasive grains is not particularly limited, and a known method can be used.

The lower limit of an average primary particle size of the abrasive grains is not particularly limited, but is preferably 5 nm or more, more preferably 7 nm or more, and still more preferably 10 nm or more. Within the range, a desired polishing speed can be easily obtained. Further, the upper limit of an average primary particle size of the abrasive grains is not particularly limited, but is preferably 50 nm or less, more preferably 40 nm or less, and still more preferably 30 nm or less. Within the range, the number of defects on the surface after treatment can be further reduced. The average primary particle size of the abrasive grains can be calculated on the assumption that the shape of silica particles is a true sphere, based on a specific surface area of the abrasive grains measured by a BET method.

The lower limit of an average secondary particle size of the abrasive grains is not particularly limited, but is preferably 5 nm or more, more preferably 10 nm or more, and still more preferably 20 nm or more. Within the range, a desired polishing speed can be easily obtained. Further, the upper limit of an average secondary particle size of the abrasive grains is not particularly limited, but is preferably 100 nm or less, more preferably 90 nm or less, and still more preferably 80 nm or less. Within the range, the number of defects on the surface after treatment can be further reduced. The average secondary particle size of the abrasive grains can be calculated based on a specific surface area of the abrasive grains measured by a light scattering method using laser light.

The abrasive grains can be used alone or in combination of two or more. Further, as the abrasive grains, a synthetic product may be used or a commercially available product may be used.

The lower limit of a content (concentration) of the abrasive grains in the polishing composition is not particularly limited, but is preferably more than 0.01% by mass, more preferably 0.1% by mass or more, and still more preferably 0.5% by mass or more, based on a total mass of the polishing composition. Within the range, a desired polishing speed can be easily obtained. Further, the upper limit of the content (concentration) of the abrasive grains is not particularly limited, but is preferably 10% by mass or less, more preferably 5% by mass or less, and still more preferably 3% by mass or less, based on the total mass of the polishing composition. Within the range, the number of defects on the surface after treatment can be further reduced and costs can be reduced.

The lower limit of a content (concentration) of the charge control agent in the polishing composition according to an embodiment of the present invention is not particularly limited, but is preferably 0.005% by mass or more, more preferably 0.01% by mass or more, and still more preferably 0.1% by mass or more, based on a total mass of the polishing composition. Further, the upper limit of the content (concentration) of the charge control agent in the polishing composition according to an embodiment of the present invention is not particularly limited, but is preferably 10% by mass or less, more preferably 5% by mass or less, and still more preferably 3% by mass or less, based on the total mass of the polishing composition. Within the range, a desired polishing speed can be easily obtained.

The composition for surface treatment according to an embodiment of the present invention may include abrasive grains. The abrasive grains may serve to mechanically remove residues of an object to be subjected to surface treatment. However, in the application of the composition for surface treatment, since the abrasive grains sometimes cause residues, it is preferred that the content thereof be as small as possible, and it is particularly preferred that the composition for surface treatment include substantially no abrasive grains. In the present description, the phrase "including substantially no abrasive grains" means that a content of the abrasive grains is 0.01% by mass or less, based on a total mass of the composition for surface treatment.

[pH Adjusting Agent]

The intermediate raw material according to an embodiment of the present invention, the polishing composition according to an embodiment of the present invention, and the composition for surface treatment according to an embodiment of the present invention may further include a pH adjusting agent. The pH adjusting agent is added mainly for adjusting the pHs of the intermediate raw material according to an embodiment of the present invention, the composition for surface treatment according to an embodiment of the present invention, and the polishing composition according to an embodiment of the present invention.

The pH adjusting agent is not particularly limited as long as it is a compound having a pH adjusting function, and known compounds can be used. Examples thereof include acid, alkali, and the like, but acid is preferred among them. These may be any one of inorganic compounds and organic compounds.

As the acid, either of an inorganic acid or an organic acid may be used. The inorganic acid is not particularly limited, but examples thereof include sulfuric acid, nitric acid, boric acid, carbonic acid, hypophosphorous acid, phosphorus acid, phosphoric acid, and the like. The organic acid is not particularly limited, but examples thereof include carboxylic acids such as formic acid, acetic acid, propionic acid, butyric acid, valeric acid, 2-methylbutyric acid, n-hexanoic acid, 3,3-dimethylbutyric acid, 2-ethylbutyric acid, 4-methylpentanoic acid, n-heptanoic acid, 2-methylhexanoic acid, n-octanoic acid, 2-ethylhexanoic acid, benzoic acid, glycolic acid, salicylic acid, glyceric acid, oxalic acid, malonic acid, succinic acid, glutaric acid, adipic acid, pimelic acid, maleic acid, phthalic acid, malic acid, tartaric acid, citric acid, and lactic acid, and methanesulfonic acid, ethanesulfonic acid, isethionic acid, and the like. Among them, maleic acid or nitric acid is more preferred and maleic acid is more preferred.

Examples of the alkali include hydroxides of alkali metals such as potassium hydroxide, ammonia, quaternary ammonium salts such as tetramethyl ammonium and tetraethyl ammonium, amines such as ethylene diamine and piperazine, and the like.

The pH adjusting agent can be used alone or in combination of two or more.

A content of the pH adjusting agent is not particularly limited, but may be appropriately selected so that pH of the intermediate raw material according to an embodiment of the present invention, the composition for surface treatment according to an embodiment of the present invention, and the polishing composition according to an embodiment of the present invention is within a desired range.

[pH]

The pH of the intermediate raw material according to an embodiment of the present invention, the polishing composition according to an embodiment of the present invention, and the composition for surface treatment according to an embodiment of the present invention is less than 7. When the pH is 7 or more, a zeta potential of a surface of an object to be polished after polishing (especially TEOS) becomes a large negative value, so that the action of the charge control agent is difficult to work. From a viewpoint that the charge control agent easily acts on the surface of the object to be polished (especially TEOS) in terms of the zeta potential, the pH is preferably less than 6, more preferably 4 or less, and still more preferably 3 or less, and particularly preferably 2.5 or less. Further, from a viewpoint of improving stability of the charge control agent, the pH is preferably 1 or more, more preferably 1.5 or more, and still more preferably 2 or more. As the pH, a value measured by the method described in the Examples is adopted.

[Other Components]

The intermediate raw material according to an embodiment of the present invention, the polishing composition according to an embodiment of the present invention, and the composition for surface treatment according to an embodiment of the present invention may include another component(s), within the range that the effect of the present invention is not inhibited. The another component(s) is not particularly limited, and for example, known components used in the polishing composition or the composition for surface treatment, such as wetting agents, surfactants, chelating agents, antiseptic agents, antifungal agents, dissolved gases, oxidizing agents, and reducing agents, can be appropriately selected.

However, in particular, in the application of the composition for surface treatment, since components other than the components required to express the intended function may cause residues, it is more preferred that a content thereof be as small as possible, and it is still more preferred that substantially no another components are included.

<Method of Producing Intermediate Raw Material, Polishing Composition, and Composition for Surface Treatment>

An embodiment of the present invention relates to a method for producing an intermediate raw material, including mixing a charge control agent having a critical packing parameter of 0.6 or more and a dispersing medium.

Another embodiment of the present invention relates to a method for producing a composition for surface treatment used for treating a surface of an object to be polished after polishing, including mixing a charge control agent having a critical packing parameter of 0.6 or more and a dispersing medium.

Another embodiment of the present invention relates to a method for producing a polishing composition used for polishing an object to be polished, including mixing a charge control agent having a critical packing parameter of 0.6 or more, a dispersing medium, and abrasive grains.

A mixing method when mixing each component is not particularly limited, and a known method can be appropriately used. Further, a mixing temperature is not particularly limited, but generally, 10 to 40° C. is preferred. Heating may be performed to increase a rate of dissolution. Further, a mixing time is not particularly limited.

In addition, in the method for producing an intermediate raw material according to an embodiment of the present invention, the method for producing a polishing composition according to an embodiment of the present invention, and the method for producing a composition for surface treatment according to an embodiment of the present invention, preferred embodiments (kind, characteristics, structure, content, and the like) of each component such as a charge control agent and a dispersing medium are as described above, and description thereof will be omitted therein.

<Polishing Method>

Another embodiment of the present invention relates to a polishing method including polishing an object to be polished using the polishing composition or using the polishing composition obtained by producing the polishing composition by the above-described production method.

A polishing apparatus and polishing conditions are not particularly limited, and a known apparatus and conditions can be appropriately used.

In the polishing apparatus, a holder for holding the object to be polished, a motor capable of changing a rotation number, and the like are mounted, and a common polishing apparatus having a polishing table to which a polishing pad (polishing cloth) can be pasted, can be used. As the polishing apparatus, either a single sided polishing apparatus or a double sided polishing apparatus may be used. As the polishing pad, common non-woven fabric, polyurethane, porous fluororesin, and the like can be used without particular limitation. It is preferred that the polishing pad be subjected to grooving so that a polishing solution is accumulated.

Polishing conditions are not particularly limited and the suitable conditions can be appropriately set depending on characteristics of the polishing composition and the object to be polished. A polishing load is not particularly limited, but generally, a polishing load of 0.1 psi (0.69 kPa) or more and 10 psi (68.9 kPa) or less per unit area is preferred, a polishing load of 0.5 psi or more and 8 psi or less per unit area is more preferred, and a polishing load of 1 psi or more and 6 psi or less per unit area is still more preferred. Within the range, damage of a substrate by the loading or occurrence of defects such as scratches on the surface can be further suppressed, while a desired polishing speed is obtained. The rotation number of the polishing table and the rotation number of a carrier are not particularly limited, but in general, are preferably 10 rpm (0.17 s$^{-1}$) or more and 500 rpm (8.3 s$^{-1}$) or less, more preferably 20 rpm or more and 300 rpm or less, and still more preferably 30 rpm or more and 200 rpm or less, respectively. A method of supplying a polishing composition is not particularly limited, but a method of continuously supplying with a pump or the like (free-flowing) may be adopted. A supply amount of the polishing composition (a flow rate of the polishing composition) is not particularly limited as long as it is the amount covering the entire object to be polished, and generally, is preferably 100 mL/min or more and 5000 mL/min or less. A polishing time is not particularly limited as long as it is appropriately set so as to obtain the intended polishing result, and generally, is preferably 5 seconds or more and 180 seconds or less.

In the object to be polished after completion of polishing, after washing the polished object with water, the surface may be dried after removing water droplets attached to the surface by a spin drier, an air blow, or the like.

<Surface Treatment Method>

Another embodiment of the present invention relates to a surface treatment method, including surface-treating an object to be polished after polishing (also referred to as a polishing-completed object to be polished or an object to be subjected to surface treatment), using the composition for surface treatment or using a composition for surface treatment obtained by producing the composition for surface treatment by the above-described production method (obtained by the above-described production method), thereby reducing residues on the surface of the object to be polished after polishing.

In the present description, the surface treatment refers to treatment for reducing residues on a surface of an object to be subjected to surface treatment, and represents a treatment of cleaning in a broad sense.

In the present description, residues represent a foreign matter attached to a surface of an object to be polished after polishing. The residues are not particularly limited, and examples thereof include organic residues, particle residues derived from abrasive grains, residues derived from the object to be polished, residues composed of a mixture of two or more thereof, and the like. The organic residues represent a component composed of organic substances such as an organic low molecular compound or polymer compound, organic salts, and the like, among the foreign matter attached to the surface of the object to be polished after polishing. Examples of the organic residue include pad wastes generated from a pad used in a polishing step described later or a rinse polishing step which may be optionally provided, components derived from an additive included in a polishing composition used in the polishing step or a rinse polishing composition used in a rinse polishing step, and the like. The number of residues can be confirmed by a wafer defect inspection apparatus, SP-2, manufactured by KLA TEN-COR. Further, since color and shape are largely different depending on the type of residues, the type of residues can be visually determined by SEM observation. Further, if necessary, the type of residues may be determined by elemental analysis with an energy dispersive X-ray analyzer (EDX).

The surface treatment method according to an embodiment of the present invention is performed by bringing the composition for surface treatment into direct contact with an object to be polished after polishing. The surface treatment method, the surface treatment apparatus, and the surface treatment condition are not particularly limited, and known methods, apparatuses, and conditions can be appropriately used.

The surface treatment is preferably a rinse polishing treatment or a cleaning treatment, and more preferably a rinse polishing treatment.

In the present description, the rinse polishing treatment represents a treatment of removing residues on a surface of an object to be polished after polishing (object to be subjected to surface treatment) by friction force (physical action) by a polishing pad and chemical action by the composition for surface treatment, performed on a polishing table (platen) to which a polishing pad is attached. Specific examples of rinse polishing treatment include treatment which comprises performing final polishing (finish polishing) on an object to be polished, placing the object to be polished after polishing (object to be subjected to surface treatment) on a polishing table (platen) of a polishing apparatus, bringing the polishing pad and the polishing-completed object to be polished into contact with each other, and sliding the polishing-completed object to be polished and the polishing pad relative to each other while the composition for surface treatment is supplied to the contact portion.

A rinse polishing apparatus and rinse polishing conditions are not particularly limited, and a known apparatus and conditions can be appropriately used.

As the rinse polishing apparatus, for example, the polishing apparatus or the polishing pad as described in the above polishing method can be used. Further, it is preferred that the rinse polishing apparatus be provided with a discharge nozzle of the composition for surface treatment, in addition to a discharge nozzle of the polishing composition.

Rinse polishing conditions are not particularly limited and the suitable conditions can be appropriately set according to the characteristics of the composition for surface treatment and the object to be polished after polishing. A rinse polishing load is not particularly limited, but generally, is preferably 0.1 psi (0.69 kPa) or more and 10 psi (68.9 kPa) or less, more preferably 0.5 psi or more and 8 psi or less, and still more preferably 1 psi or more and 6 psi or less, per a unit area of a substrate. Within the range, damage of a substrate by the loading or occurrence of defects such as scratches on the surface can be further suppressed, while attaining a high residue removal effect. The rotation number of a polishing table and the rotation number of a carrier are not particularly limited, but in general, are preferably 10 rpm (0.17 $s^{-1}$) or more and 500 rpm (8.3 $s^{-1}$) or less, more preferably 20 rpm or more and 300 rpm or less, and still more preferably 30 rpm or more and 200 rpm or less, respectively. A method of supplying the composition for surface treatment is not particularly limited, but a method of continuously supplying with a pump or the like (free-flowing) may be adopted. A supply amount of the composition for surface treatment (a flow rate of the composition for surface treatment) is not particularly limited as long as it is the amount covering the entire object to be polished, and generally, is preferably 100 mL/min or more and 5000 mL/min or less. A rinse polishing treatment time is not particularly limited as long as it is appropriately set so as to obtain the intended residue removal effect, and generally, is preferably 5 seconds or more and 180 seconds or less.

In the present description, the cleaning treatment represents a treatment in which residues on a surface of an object to be subjected to surface treatment is removed by chemical action by the composition for surface treatment, performed in the state that the object to be polished after polishing (object to be subjected to surface treatment) is removed on a polishing table (platen). Specific examples of the cleaning treatment include a treatment which comprises performing final polishing (finish polishing) on an object to be polished, or performing rinse polishing treatment following final polishing, removing an object to be subjected to surface treatment from a polishing table (platen) and bringing the object to be polished into contact with the composition for surface treatment. While the composition for surface treatment and the object to be subjected to surface treatment are brought into contact with each other, a means for applying a frictional force (physical action) to the surface of the object to be subjected to surface treatment may be further used.

The cleaning treatment method, the cleaning treatment apparatus, and the cleaning treatment condition are not particularly limited, and known methods, apparatuses, and conditions can be appropriately used.

Examples of the cleaning treatment method include a method which comprises immersing a polishing-completed object to be polished in the composition for surface treatment, and if necessary performing ultrasonic treatment, or a method which comprises bringing a cleaning brush into contact with a polishing-completed object to be polished (an object to be subjected to surface treatment) while holding the polishing-completed object to be polished, brushing the surface of the polishing-completed object to be polished while supplying the composition for surface treatment to the contact portion, and the like.

The cleaning apparatus is not particularly limited, and a known apparatus can be appropriately used. Further, cleaning conditions are not particularly limited and the suitable conditions can be appropriately set according to the characteristics of the composition for surface treatment and the polishing-completed object to be polished.

Cleaning with water may be performed before, after, or before and after the surface treatment method according to an embodiment of the present invention. Thereafter, water droplets attached to the surface of the polishing-completed object to be polished may be removed and dried by a spin dryer, an air blow, or the like.

<Method of Producing Semiconductor Substrate>

When the method of producing a semiconductor substrate according to the present invention uses the polishing composition according to an embodiment of the present invention, it is preferred to include a step of polishing the object to be polished by the above-described polishing method (polishing method). In the production method, a step which can be adopted for a known method of producing a semiconductor substrate can be appropriately adopted, as another step. Further, when the method of producing a semiconductor substrate according to the present invention uses the composition for surface treatment according to an embodiment of the present invention, it is preferred to include a step of reducing residues on the surface of the object to be polished after polishing by the above-described surface treatment method (surface treatment method). In the production method, a step which can be adopted for a known method of producing a semiconductor substrate can be appropriately adopted, as another step.

While the embodiments of the present invention have been described in detail, they are illustrative, exemplary, and not restrictive, and it is apparent that the scope of the present invention should be interpreted by the appended claims.

The present invention includes the following aspects and embodiments.

1. An intermediate raw material, including a charge control agent having a critical packing parameter of 0.6 or more and a dispersing medium, wherein pH of the intermediate raw material is less than 7.

2. The intermediate raw material according to 1., wherein the charge control agent has at least one of a substituted or unsubstituted linear or branched alkyl group having 8 to 20 carbon atoms and a substituted or unsubstituted aryl group having 6 to 20 carbon atoms, as a hydrophobic group.

3. The intermediate raw material according to 2., wherein the charge control agent has two or more substituted or unsubstituted aryl groups having 6 to 20 carbon atoms as the hydrophobic group.

4. The intermediate raw material according to any one of 1. to 3., wherein the charge control agent has at least one selected from the group consisting of a sulfuric acid group, a sulfonic acid group, a phosphoric acid group, a phosphate ester group, and a phosphite ester group, as a hydrophilic group.

5. A composition for surface treatment used for treating a surface of an object to be polished after polishing, which includes the intermediate raw material as defined in any one of 1. to 4., and has pH of less than 7.

6. The composition for surface treatment according to 5., wherein the object to be polished contains at least one selected from the group consisting of silicon oxide, silicon nitride, and polysilicon.

7. The composition for surface treatment according to 5. or 6., wherein the composition does not substantially include abrasive grains.

8. A method for producing a composition for surface treatment used for treating a surface of an object to be polished after polishing, the method including mixing a charge control agent having a critical packing parameter of 0.6 or more with a dispersing medium.

9. A surface treatment method including surface-treating an object to be polished after polishing using the composition for surface treatment as defined in any one of 5. to 7., or using the composition for surface treatment obtained after producing the composition for surface treatment by the method of producing according to 8., to reduce residues on a surface of the object to be polished after polishing.

10. The surface treatment method according to 9., wherein the surface treatment is a rinse polishing treatment or a cleaning treatment.

11. A method for producing a semiconductor substrate, including performing a surface treatment for reducing residues on a surface of an object to be polished after polishing by the surface treatment method as defined in 9. or 10., wherein the object to be polished is the semiconductor substrate.

12. A polishing composition used for polishing an object to be polished, which includes the intermediate raw material as defined in any one of 1. to 4., and abrasive grains, and has pH of less than 7.

13. The polishing composition according to 12., wherein the abrasive grains contain colloidal silica.

14. The polishing composition according to 12. or 13., wherein the object to be polished contains at least one selected from the group consisting of silicon oxide, silicon nitride, and polysilicon.

15. A method of producing a polishing composition used for polishing an object to be polished, the method including mixing a charge control agent having a critical packing parameter of 0.6 or more, a dispersing medium, and abrasive grains.

16. A polishing method including polishing an object to be polished using the polishing composition as defined in any one of 12. to 14., or using the polishing composition obtained after producing the polishing composition by the method or producing according to 15.

17. A method of producing a semiconductor substrate, including the polishing method as defined in 16.

EXAMPLES

The present invention will be described in more detail by means of the following Examples and Comparative Examples. However, the technical scope of the present invention is not limited to the following Examples. Unless otherwise stated, "%" and "parts" mean "% by mass" and "part by mass", respectively.

The pH of the composition for surface treatment or the polishing composition (liquid temperature: 25° C.) was confirmed by a pH meter (manufactured by Horiba, Ltd., product name: LAQUA (registered trademark)).

Further, the zeta potential of a TEOS substrate and a SiN substrate (silicon nitride substrate) in the treatment using a composition for surface treatment or a polishing composition was measured using ELSZ manufactured by Otsuka Electronics Co., Ltd. As the substrate, a substrate made into a coupon of 10 mm×30 mm was used. As standard particles, polystyrene particles for measuring zeta potential were used.

For the weight average molecular weight of a polyacrylic acid, polyglutamic acid, and sulfonic acid/carboxylic acid copolymer, a weight average molecular weight (in terms of polyethylene glycol) measured by gel permeation chromatography (GPC) was used. Specifically, the weight average molecular weight was measured by the following equipment and conditions:
GPC apparatus: manufactured by Shimadzu Corporation
Model: Prominence+ELSD detector (ELSD-LTII)
Column: VP-ODS (manufactured by Shimadzu Corporation)
Mobile phase A: MeOH
Mobile phase B: 1% aqueous acetic acid solution Flow rate: 1 mL/min
Detector: ELSD temp. 40° C., Gain 8, $N_2$ GAS 350 kPa
Oven temperature: 40° C.
Injection amount: 40 μL.
<Composition for Surface Treatment>
[Preparation of Composition for Surface Treatment]

Example 1: Preparation of Composition for Surface Treatment A-1

Dilauryl hydrogen phosphite as the charge control agent and water (deionized water) as the dispersing medium were mixed in an amount so that the content of dilauryl hydrogen phosphate was 0.1% by mass, based on the total mass of the finally obtained composition for surface treatment, thereby obtaining an intermediate raw material. Thereafter, a sulfonic acid/carboxylic acid copolymer (weight average molecular weight (Mw): 10,000, monomer having a sulfonic acid group: monomer having a carboxylic acid group=50:50 in a mole ratio) as the ionic dispersant was mixed with the intermediate raw material in an amount of 0.1% by mass, based on the total mass of the composition for surface treatment, and maleic acid as the pH adjusting agent was added thereto so that the pH of the polishing composition is 2.0, thereby preparing a composition for surface treatment A-1.

Examples 2 to 12 and Comparative Examples 1 to 7: Preparation of Compositions for Surface Treatment A-2 to A-19

Compositions for surface treatment A-2 to A-19 were prepared in the same manner as in Example 1, except that the type of pH adjusting agent, the pH of the composition for surface treatment, the type and content of charge control agent, and the type of ionic dispersant were changed as shown in the following Table 1. In Table 1, "mole ratio of sulfonic acid/carboxylic acid" represents a mole ratio of a constituent structure derived from a monomer having sulfonic acid group to a constituent structure derived from a monomer having a carboxylic acid group in a sulfonic acid/carboxylic acid copolymer. Further, in Table 1, "polyoxyethylene triaryl alkyl phenyl ether phosphate ester" represents a compound represented by the following structure: Polyoxyethylene triaryl alkyl phenyl ether phosphate ester

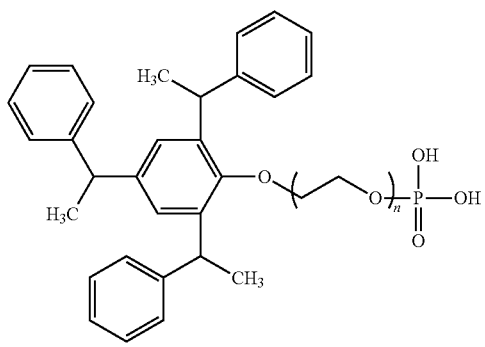

[Evaluation of Number of Residues]
(CMP Step)
For a TEOS substrate and a SiN substrate which are a semiconductor substrate, a polishing composition M (composition; 4% by mass of sulfonic acid-modified colloidal silica (manufactured by the method described in "Sulfonic acid-functionalized silica through quantitative oxidation of thiol groups", Chem. Commun. 246-247 (2003), an average primary particle size of 30 nm, and an average secondary particle size of 60 nm), 1% by mass of ammonium sulfate, 0.018% by mass of an aqueous maleic acid solution having a concentration of 30% by mass, solvent: water) was used, and polishing was performed, respectively, under the following conditions. Here, as the TEOS substrate and the SiN substrate, a 300 mm wafer was used;
—Polishing Apparatus and Polishing Conditions—
Polishing apparatus: FREX 300E manufactured by Ebara Corporation
Polishing pad: rigid polyurethane pad IC1010 manufactured by Nitta Haas Incorporated
Polishing pressure: 2.0 psi (1 psi=6894.76 Pa, same applies hereinafter)
Rotation number of polishing table: 60 rpm
Rotation number of head: 60 rpm
Supply of polishing composition M: free flowing
Supply amount of polishing composition: 300 mL/min
Polishing time: 60 seconds
(Rinse Polishing Treatment Step)

After the surfaces of the TEOS substrate and the SiN substrate were polished in the CMP step, the polishing-completed TEOS substrate and the polishing-completed SiN substrate were respectively removed from the polishing table (platen). Subsequently, in the same polishing apparatus, the polishing-completed TEOS substrate and the polishing-completed SiN substrate were respectively mounted on another polishing table (platen), and subjected to the following rinse polishing treatment;
—Rinse Polishing Apparatus and Rinse Polishing Conditions—
Polishing apparatus: FREX 300E manufactured by Ebara Corporation
Polishing pad: rigid polyurethane pad IC1010 manufactured by Nitta Haas Incorporated
Polishing pressure: 2.0 psi (1 psi=6894.76 Pa, same applies hereinafter)
Rotation number of polishing table: 60 rpm
Rotation number of head: 60 rpm
Supply of compositions for surface treatment A-1 to A-19: free flowing
Supply amount of composition for surface treatment: 300 mL/min
Rinse polishing treatment time: 60 seconds
(Water Cleaning Step)
For each of the rinse polishing treatment-completed substrates as obtained above, the cleaning portion was scrub-cleaned for 60 seconds using deionized water with a cleaning brush made of polyvinyl alcohol, and then spin drying was performed for 30 seconds.
(Measurement of Number of Residues)
For the TEOS substrate and the SiN substrate after the cleaning step, the number of residues of 0.10 μm or more in size was counted. For measurement of the number of residues, a wafer defect inspection apparatus, SP-2, manufactured by KLA TENCOR was used. The measurement was performed on a portion excluding the portion of 5 mm in width from the outer peripheral end of one surface of the TEOS substrate and the SiN substrate (portion from a width of 0 mm to a width of 5 mm when the outer peripheral end is regarded to be 0 mm). It is preferred that the number of residues be as small as possible. The results are shown in the following Table 1.

TABLE 1

| | No. | Type of pH adjusting agent | pH of composition for surface treatment | Charge control agent Type | Content (% by mass) | CPP | Content (% by mass) | Mw | Mole ratio of sulfonic acid/ carboxylic acid | SiN zeta potential (mv) | TEOS zeta potential (mv) | SiN substrate evaluation Number of residues | TEOS substrate evaluation Number of residues |
|---|---|---|---|---|---|---|---|---|---|---|---|---|---|
| Example 1 | A-1 | Maleic acid | 2 | Dilauryl hydrogen phosphite | 0.1 | 0.92 | 0.1 | 10000 | 50:50 | — | −26.2 | — | 215 |
| Example 2 | A-2 | Maleic acid | 2 | 2-Ethylhexyl acid phosphate | 0.1 | 0.95 | 0.1 | 10000 | 50:50 | — | −22.6 | — | 118 |
| Example 3 | A-3 | Maleic acid | 2 | Polyoxyethylene (n = 3) styrenated phenyl ether ammonium sulfate | 0.1 | 0.92 | 0.1 | 10000 | 50:50 | — | −38.2 | — | 102 |
| Example 4 | A-4 | Maleic acid | 2 | Polyoxyethylene (n = 5) styrenated phenyl ether ammonium sulfate | 0.1 | 1.02 | 0.1 | 10000 | 50:50 | — | −48.3 | — | 114 |
| Example 5 | A-5 | Maleic acid | 2 | Polyoxyethylene (n = 7) styrenated phenyl ether ammonium sulfate | 0.1 | 1.12 | 0.1 | 10000 | 50:50 | −62.3 | −39.4 | 135 | 126 |
| Example 6 | A-6 | Maleic acid | 2 | Polyoxyethylene (n =7) styrenated phenyl ether ammonium sulfate | 0.1 | 1.12 | 0.1 | 10000 | 50:50 | −50.4 | −44.2 | 200 | 130 |
| Example 7 | A-7 | Maleic acid | 2 | Polyoxyethylene (n = 12) styrenated phenyl ether ammonium sulfate | 1.0 | 1.36 | 0.1 | 10000 | 50:50 | — | −23.1 | — | 271 |
| Example 8 | A-8 | Nitric acid | 2 | Polyoxyethylene (n = 7) styrenated phenyl ether ammonium sulfate | 0.01 | 1.12 | 0.1 | 10000 | 50:50 | −52 | −46.1 | 145 | 138 |
| Example 9 | A-9 | Nitric acid | 4 | Polyoxyethylene (n = 7) styrenated phenyl ether ammonium sulfate | 1.0 | 1.12 | 0.1 | 10000 | 50:50 | — | −29.1 | — | 213 |
| Example 10 | A-10 | Maleic acid | 2 | Polyoxyethylene (n = 3) styrenated phenyl ether ammonium sulfate | 0.1 | 0.92 | 0.1 | 10000 | 70:30 | — | −38.2 | — | 88 |
| Example 11 | A-11 | Maleic acid | 2 | Polyoxyethylene (n =3) styrenated phenyl ether ammonium sulfate | 0.1 | 0.92 | 0.1 | 10000 | 20:80 | — | −38.2 | — | 134 |
| Example 12 | A-12 | Maleic acid | 2 | Polyoxyethylene triaryl alkyl phenyl ether phosphate ester | 0.1 | 1.034 | 0.1 | 10000 | 50:50 | −40.2 | −38.1 | 36 | 78 |
| Comparative Example 1 | A-13 | Maleic acid | 2 | None | — | — | 0.1 | 10000 | 50:50 | 45.8 | −4.0 | 220000 | 521 |
| Comparative Example 2 | A-14 | Maleic acid | 2 | Polyacrylic acid (Mw = 10000) | 0.1 | — | 0.1 | 10000 | 50:50 | — | −1.0 | — | 524 |
| Comparative Example 3 | A-15 | Maleic acid | 2 | Polyvinylpyrrolidone | 0.1 | — | 0.1 | 10000 | 50:50 | −0.2 | −1.0 | 240000 | 329 |
| Comparative Example 4 | A-16 | Maleic acid | 2 | Etidronic acid (1-hydroxyethane-1,1-diphosphonic acid) | 0.1 | — | 0.1 | 10000 | 50:50 | — | −2.0 | — | 761 |
| Comparative Example 5 | A-17 | Maleic acid | 2 | Lauryl sulfate | 0.1 | 0.37 | 0.1 | 10000 | 50:50 | — | 1.5 | — | 498 |
| Comparative Example 6 | A-18 | Maleic acid | 2 | Ethyl acid phosphate | 0.1 | 0.34 | 0.1 | 10000 | 50:50 | — | −7.8 | — | 508 |
| Comparative Example 7 | A-19 | Maleic acid | 2 | Polyglutamic acid (Mw = 100000) | 0.1 | — | 0.1 | 10000 | 50:50 | — | −2.0 | — | 230000 |

It is clearly noted from the above Table 1 that when the compositions for surface treatment A-1 to A-12 according to the present invention were used, the numbers of residues on the surface of the TEOS substrate and on the surface of the SiN substrate were significantly reduced. On the other hand, when the compositions for surface treatment A-13 to A-19 which are outside the scope of the present invention were used, the number of residues was insufficiently reduced.

<Polishing Composition>
[Preparation of Polishing Composition]

Example 13: Preparation of Polishing Composition B-1

Dilauryl hydrogen phosphite as the charge control agent and water (deionized water) as the dispersing medium were mixed in an amount so that the content of dilauryl hydrogen phosphate was 0.1% by mass, based on the total mass of the finally obtained polishing composition, thereby obtaining an intermediate raw material. Thereafter, sulfonic acid-modified colloidal silica (an average primary particle size of 30 nm and an average secondary particle size of 60 nm) as the abrasive grains was mixed with the intermediate raw material in an amount of 1% by mass, based on the total mass of the polishing composition, and maleic acid as the pH adjusting agent was added thereto so that the pH of the polishing composition was 2.0, thereby preparing a polishing composition B-1.

Examples 14 to 21 and Comparative Examples 8 to 11: Preparation of Polishing Compositions B-2 to B-13

Polishing compositions B-2 to B-13 were prepared in the same manner as in Example 13, except that the type of pH adjusting agent, and the type and addition amount of charge control agent were changed as shown in the following Table 2.

[Evaluation of Polishing Speed]
(CMP Step)

For the TEOS substrate which is a semiconductor substrate, each of the polishing compositions obtained above was used to perform polishing under the following conditions, respectively. Here, the TEOS substrate used was a 300 mm wafer;

—Polishing Apparatus and Polishing Conditions—
Polishing apparatus: FREX 300E manufactured by Ebara Corporation
Polishing pad: rigid polyurethane pad IC1010 manufactured by Nitta Haas Incorporated
Polishing pressure: 2.0 psi
Rotation number of polishing table: 60 rpm
Rotation number of head: 60 rpm
Supply of polishing compositions B-1 to B-15: free flowing
Supply amount of polishing composition: 300 mL/min
Polishing time: 60 seconds
(Evaluation of Polishing Speed)

Thicknesses (film thickness) of the TEOS substrate before and after the CMP step were measured by an optical film thickness measuring device (ASET-f5x; manufactured by KLA-Tencor). A difference between the thicknesses (film thickness) of the TEOS substrate before and after the CMP step was determined, divided by a polishing time, and units were adjusted, thereby calculating a polishing speed (Å/min). The results are shown in the following Table 2. Here, 1 Å=0.1 nm.

TABLE 2

| | | Abrasive grain | | Type of pH adjusting agent | pH of polishing composition | Charge control agent | | | TEOS zeta potential (mV) | Evaluation Polishing speed (Å/min) |
|---|---|---|---|---|---|---|---|---|---|---|
| | No. | Type | Content (% by mass) | | | Type | Content (% by mass) | CPP | | |
| Example 13 | B-1 | Sulfonic acid-modified | 1.0 | Maleic acid | 2.0 | Dilauryl hydrogen phosphite | 0.1 | 0.92 | −26.2 | 24 |
| Example 14 | B-2 | Sulfonic acid-modified | 1.0 | Maleic acid | 2.0 | 2-Ethylhexyl acid phosphate | 0.1 | 0.95 | −22.6 | 23 |
| Example 15 | B-3 | Sulfonic acid-modified | 1.0 | Maleic acid | 2.0 | Polyoxyethylene (n = 3) styrenated phenyl ether ammonium sulfate | 0.1 | 0.92 | −38.2 | 18 |
| Example 16 | B-4 | Sulfonic acid-modified | 1.0 | Maleic acid | 2.0 | Polyoxyethylene (n = 5) styrenated phenyl ether ammonium sulfate | 0.1 | 1.02 | −48.3 | 15 |
| Example 17 | B-5 | Sulfonic acid-modified | 1.0 | Maleic acid | 2.0 | Polyoxyethylene (n = 7) styrenated phenyl ether ammonium sulfate | 0.1 | 1.12 | −39.4 | 18 |
| Example 18 | B-6 | Sulfonic acid-modified | 1.0 | Maleic acid | 2.0 | Polyoxyethylene (n = 7) styrenated phenyl ether ammonium sulfate | 1.0 | 1.12 | −44.2 | 19 |
| Example 19 | B-7 | Sulfonic acid-modified | 1.0 | Maleic acid | 2.0 | Polyoxyethylene (n = 12) styrenated phenyl ether ammonium sulfate | 0.01 | 1.36 | −23.1 | 21 |
| Example 20 | B-8 | Sulfonic acid-modified | 1.0 | Nitric acid | 2.0 | Polyoxyethylene (n = 7) styrenated phenyl ether ammonium sulfate | 0.1 | 1.12 | −48.1 | 22 |
| Example 21 | B-9 | Sulfonic acid-modified | 1.0 | Nitric acid | 4.0 | Polyoxyethylene (n = 7) styrenated phenyl ether ammonium sulfate | 0.1 | 1.12 | −25.4 | 31 |
| Comparative Example 8 | B-10 | Sulfonic acid-modified | 1.0 | Maleic acid | 2.0 | None | — | — | −4.0 | 125 |
| Comparative Example 9 | B-11 | Sulfonic acid-modified | 1.0 | Maleic acid | 2.0 | Etidronic acid (1-hydroxyethane-1,1-diphosphonicacid) | 0.1 | — | −2.0 | 131 |
| Comparative Example 10 | B-12 | Sulfonic acid-modified | 1.0 | Maleic acid | 2.0 | Lauryl sulfate | 0.1 | 0.37 | 1.5 | 98 |
| Comparative Example 11 | B-13 | Sulfonic acid-modified | 1.0 | Maleic acid | 2.0 | Ethyl acid phosphate | 0.1 | 0.34 | −7.8 | 101 |

When the polishing composition is used in polishing of the object to be polished containing silicon oxide using TEOS or the like as a raw material, from the relationship with other objects to be polished, it is required to arbitrarily adjust a polishing speed, for example, decreasing the polishing speed of the silicon oxide or increasing the polishing speed of silicon oxide.

The polishing compositions of Examples 13 to 21 contain a charge control agent and sulfonic acid-modified silica. Since the surface of abrasive grains is negatively charged and the TEOS substrate is also negatively charged, it was found that by the polishing compositions of Examples 13 to 21, the polishing speed of the TEOS substrate can be suppressed. On the other hand, it was found that by the polishing compositions of Comparative Examples 8 to 11 which are outside the scope of the present invention, the polishing speed of the TEOS substrate cannot be suppressed.

Example 22 and Comparative Example 12:
Preparation of Polishing Composition B-14 and B-15

Polishing compositions B-14 and B-15 were prepared in the same manner as in Example 15 and Comparative Example 8, respectively, except that the abrasive grains were changed to amino group modified colloidal silica (an average primary particle size of 30 nm and an average secondary particle size of 60 nm).

The resultant polishing compositions B-14 and B-15 were used to evaluate a polishing speed in the same manner as in the above. The results are shown in the following Table 3.

TABLE 3

| | | Abrasive grain | | Type | | Charge control agent | | | TEOS | Evaluation |
|---|---|---|---|---|---|---|---|---|---|---|
| | No. | Type | Content (% by mass) | of pH adjusting agent | pH of polishing composition | Type | Content (% by mass) | CPP | zeta potential (mV) | Polishing speed (Å/min) |
| Example 22 | B-14 | Amino group-modified | 1.0 | Maleic acid | 2.0 | Polyoxyethylene (n = 3) styrenated phenyl ether ammonium sulfate | 0.1 | 0.92 | −38.2 | 478 |
| Comparative Example 12 | B-15 | Amino group-modified | 1.0 | Maleic acid | 2.0 | None | — | — | −4.0 | 122 |

It is noted that the polishing composition of Example 22 contains a charge control agent and amino group-modified silica. Since the surface of abrasive grains is positively charged and the TEOS substrate is negatively charged, it was found that by the polishing composition of Example 22, the polishing speed of the TEOS substrate can be improved. On the other hand, it was found that by the polishing composition of Comparative Example 12 which is outside the scope of the present invention, the polishing speed of the TEOS substrate cannot be improved.

What is claimed is:

1. A polishing composition for polishing an object to be polished, the polishing composition comprising:
    a charge control agent having a critical packing parameter of 0.6 or more, wherein the charge control agent is at least one selected from the group consisting of: dilauryl hydrogen phosphite, 2-ethylhexyl acid phosphate, polyoxyethylene (n=3) styrenated phenyl ether ammonium sulfate, polyoxyethylene (n=5) styrenated phenyl ether ammonium sulfate, polyoxyethylene (n=7) styrenated phenyl ether ammonium sulfate, polyoxyethylene (n=12) styrenated phenyl ether ammonium sulfate;
    a dispersing medium; and
    abrasive grains, wherein:
        pH of the polishing composition is less than 7; and
        the abrasive grains are amino group modified abrasive grains and have a surface that is positively charged.

2. The polishing composition according to claim 1, wherein the abrasive grains contain colloidal silica.

3. The polishing composition according to claim 1, wherein the object to be polished contains at least one selected from the group consisting of silicon oxide, silicon nitride, and polysilicon.

4. A method of producing a polishing composition for polishing an object to be polished according to claim 1, the method comprising mixing the charge control agent, the dispersing medium, and the abrasive grains.

5. A polishing method comprising polishing an object to be polished, using the polishing composition according to claim 1.

6. A method of producing a semiconductor substrate, comprising the polishing method according to claim 5.

* * * * *